US011881386B2

(12) United States Patent
Kuo et al.

(10) Patent No.: US 11,881,386 B2
(45) Date of Patent: Jan. 23, 2024

(54) COATING DEVICE FOR CURVED SUBSTRATE AND COATING METHOD CONTAINING THE SAME

(71) Applicant: InnoLux Corporation, Miao-Li County (TW)

(72) Inventors: Ching-Feng Kuo, Miao-Li County (TW); Chin Lung Ting, Miao-Li County (TW); Ying-Yao Tang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/370,410

(22) Filed: Jul. 8, 2021

(65) Prior Publication Data

US 2022/0059328 A1 Feb. 24, 2022

(30) Foreign Application Priority Data

Aug. 18, 2020 (CN) .......................... 202010834726.0

(51) Int. Cl.
*H01J 37/34* (2006.01)
*C23C 14/34* (2006.01)
*C23C 14/54* (2006.01)

(52) U.S. Cl.
CPC .......... *H01J 37/3488* (2013.01); *C23C 14/34* (2013.01); *C23C 14/54* (2013.01); *H01J 37/3464* (2013.01); *H01J 2237/332* (2013.01)

(58) Field of Classification Search
CPC ............... H01J 37/3488; H01J 37/3464; H01J 2237/332; C23C 14/34; C23C 14/54;
(Continued)

(56) References Cited

U.S. PATENT DOCUMENTS

2011/0220022 A1\* 9/2011 Hong ..................... C23C 14/54
 118/663
2012/0080309 A1\* 4/2012 Bender ............... H01J 37/3473
 204/192.12

(Continued)

FOREIGN PATENT DOCUMENTS

CN 108359944 A \* 8/2018 ............. C23C 14/34
CN 108359944 A 8/2018
(Continued)

OTHER PUBLICATIONS

CN-108359944-A Translation (Year: 2018).\*
JP-2010277094-A Translation (Year: 2010).\*

*Primary Examiner* — Jennifer Wecker
*Assistant Examiner* — Patrick S Ott
(74) *Attorney, Agent, or Firm* — MUNCY, GEISSLER, OLDS & LOWE, P.C.

(57) ABSTRACT

A method for coating a curved substrate is disclosed, which includes: providing a coating device including: a chamber, a carrying platform, a sputtering mechanism, and a position-adjusting mechanism, wherein the carrying platform is disposed in the chamber and has a first surface, the sputtering mechanism is disposed in the chamber and is disposed corresponding to the carrying platform, and the position-adjusting mechanism is disposed in the chamber; providing a curved substrate, wherein the curved substrate is disposed on the first surface of the carrying platform and the curved substrate has a second surface; adjusting the sputtering mechanism to different positions by the position-adjusting mechanism; and sputtering a coating material to different parts of the second surface of the curved substrate by the sputtering mechanism at the different positions.

17 Claims, 7 Drawing Sheets

(58) Field of Classification Search
CPC ... C23C 14/3492; C23C 14/35; C23C 14/542; C23C 14/562
See application file for complete search history.

(56) References Cited

U.S. PATENT DOCUMENTS

| | | | |
|---|---|---|---|
| 2012/0231633 A1* | 9/2012 | Ewert | C23C 16/481 |
| | | | 118/724 |
| 2015/0120216 A1* | 4/2015 | Vukkadala | G01L 5/0047 |
| | | | 702/35 |
| 2016/0093477 A1* | 3/2016 | Rogers | H01J 37/3417 |
| | | | 204/192.12 |
| 2016/0186312 A1* | 6/2016 | Wang | C23C 14/505 |
| | | | 204/192.15 |
| 2017/0207071 A1* | 7/2017 | De Bosscher | C23C 14/542 |
| 2019/0003039 A1* | 1/2019 | Portka | C23C 14/3464 |
| 2019/0341234 A1* | 11/2019 | Weichart | H01J 37/32568 |

FOREIGN PATENT DOCUMENTS

| | | | | |
|---|---|---|---|---|
| CN | 109136876 A | 1/2019 | | |
| JP | 2010277094 A | * 12/2010 | | G02B 5/205 |

\* cited by examiner

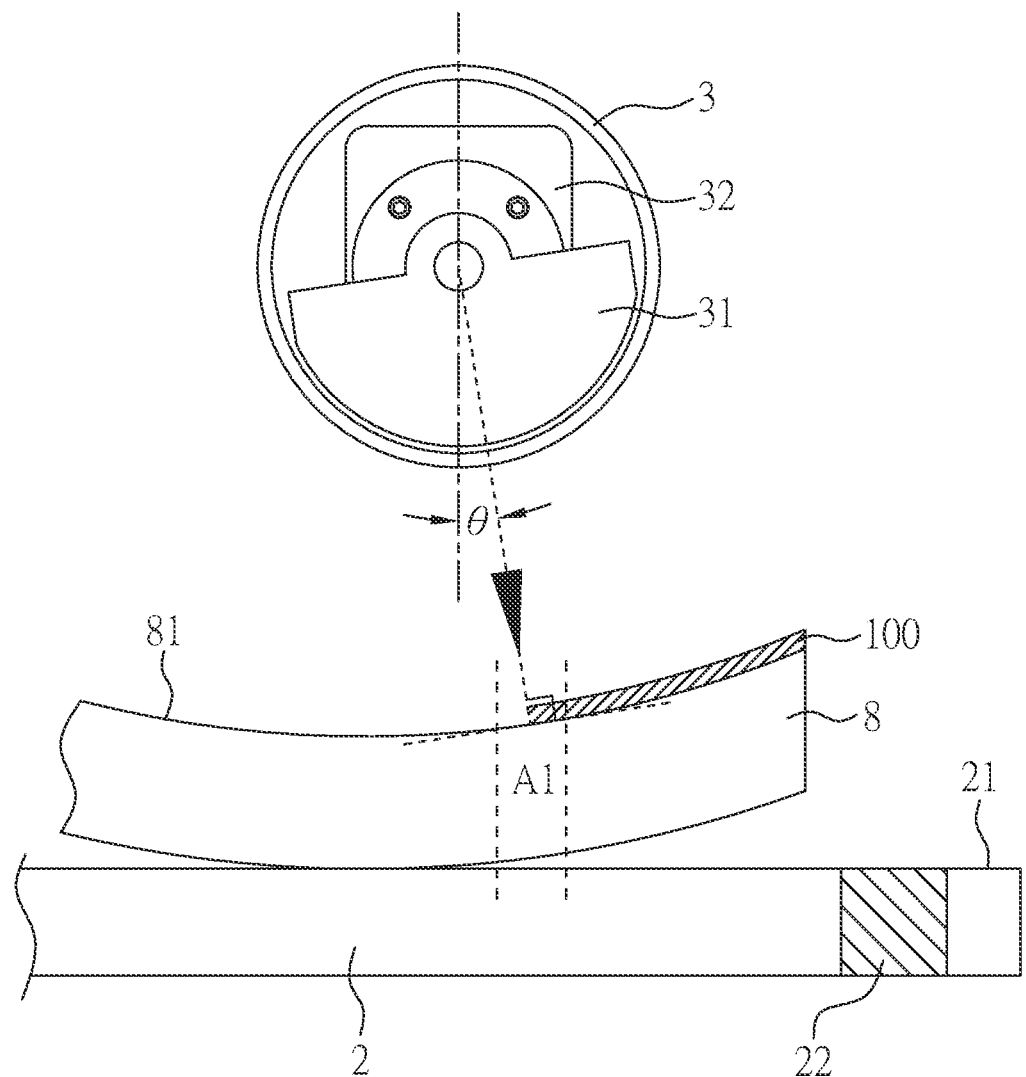
FIG. 5A
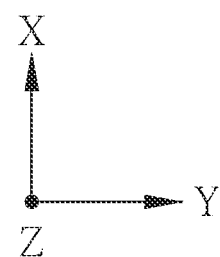

US 11,881,386 B2

COATING DEVICE FOR CURVED SUBSTRATE AND COATING METHOD CONTAINING THE SAME

CROSS REFERENCE TO RELATED APPLICATION

This application claims the benefits of the Chinese Patent Application Serial Number 202010834726.0, filed on Aug. 18, 2020, the subject matter of which is incorporated herein by reference.

BACKGROUND

1. Field

The present disclosure relates to a coating device and a coating method containing the same. More specifically, the present disclosure relates a coating device for curved substrates and a coating method containing the same.

2. Description of Related Art

With the continuous advancement of technologies and the increase in consumer's desire, the demand for curved displays has gradually increased. When the curved substrate corresponding to the curved display is sputtered, the distance between the curved substrate and the target is inconsistent, resulting in the uneven thickness of the deposited coating. Accordingly, it results in chromatic aberration on its appearance and affects the quality of the coating, thereby having impact on the display of the curved display device.

Therefore, it is desirable to provide a coating device for curved substrates and a coating method comprising the same in order to solve the shortcomings in the past.

SUMMARY

In light of the above, the present disclosure provides a coating device for a curved substrate and a coating method including the same, which can improve the uniformity of the coating thickness.

In order to achieve the above and other objectives, the present disclosure provides a method for coating a curved substrate, comprising: providing a coating device comprising: a chamber, a carrying platform, a sputtering mechanism, and a position-adjusting mechanism, wherein the carrying platform is disposed in the chamber and has a first surface, the sputtering mechanism is disposed in the chamber and is disposed corresponding to the carrying platform, and the position-adjusting mechanism is disposed in the chamber; providing a curved substrate, wherein the curved substrate is disposed on the first surface of the carrying platform and the curved substrate has a second surface; adjusting the sputtering mechanism to different positions by the position-adjusting mechanism; and sputtering a coating material to different parts of the second surface of the curved substrate by the sputtering mechanism at the different positions.

The present disclosure further provides a coating device for curved substrates, comprising: a chamber; a carrying platform disposed in the chamber and having a first s face, wherein the carrying platform is used to carry a curved substrate and the curved substrate has a second surface; a sputtering mechanism disposed in the chamber and corresponding to the carrying platform, wherein the sputtering mechanism is used to sputter a coating material to different parts of the second surface of the curved substrate at different positions; and a position-adjusting mechanism disposed in the chamber, wherein the position-adjusting mechanism is used to adjust the sputtering mechanism to different positions.

Other novel features of the present disclosure will become more apparent from the following detailed description when taken in conjunction with the accompanying drawings.

BRIEF DESCRIPTION OF THE DRAWINGS

FIG. 5A and FIG. 5B are enlarged views of FIG. 4B and FIG. 4C, respectively.

DETAILED DESCRIPTION OF EMBODIMENT

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

Ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. The ordinal numbers are only intended to distinguish a component with a name from another component with the same name.

Moreover, in the present specification, a value may be interpreted to cover a range within ±20% of the value, and in particular, a range thin±10%, ±5%, ±2%, ±1% or ±0.5% of the value, except otherwise specified. The value provided in the present specification is an approximate value, which means the meaning "about" is also included in the present disclosure without specifically specifying "about".

Furthermore, the terms recited in the specification and the claims such as "above", "over", or "on" are intended not only directly contact with the other element, but also intended indirectly contact with the other element.

The detailed structure of the coating device of the present disclosure will be described in detail below, but the present disclosure is not limited to the following exemplary embodiments. The embodiments of the present disclosure can be combined with each other or other known structures to form another embodiment.

Figure 1A:
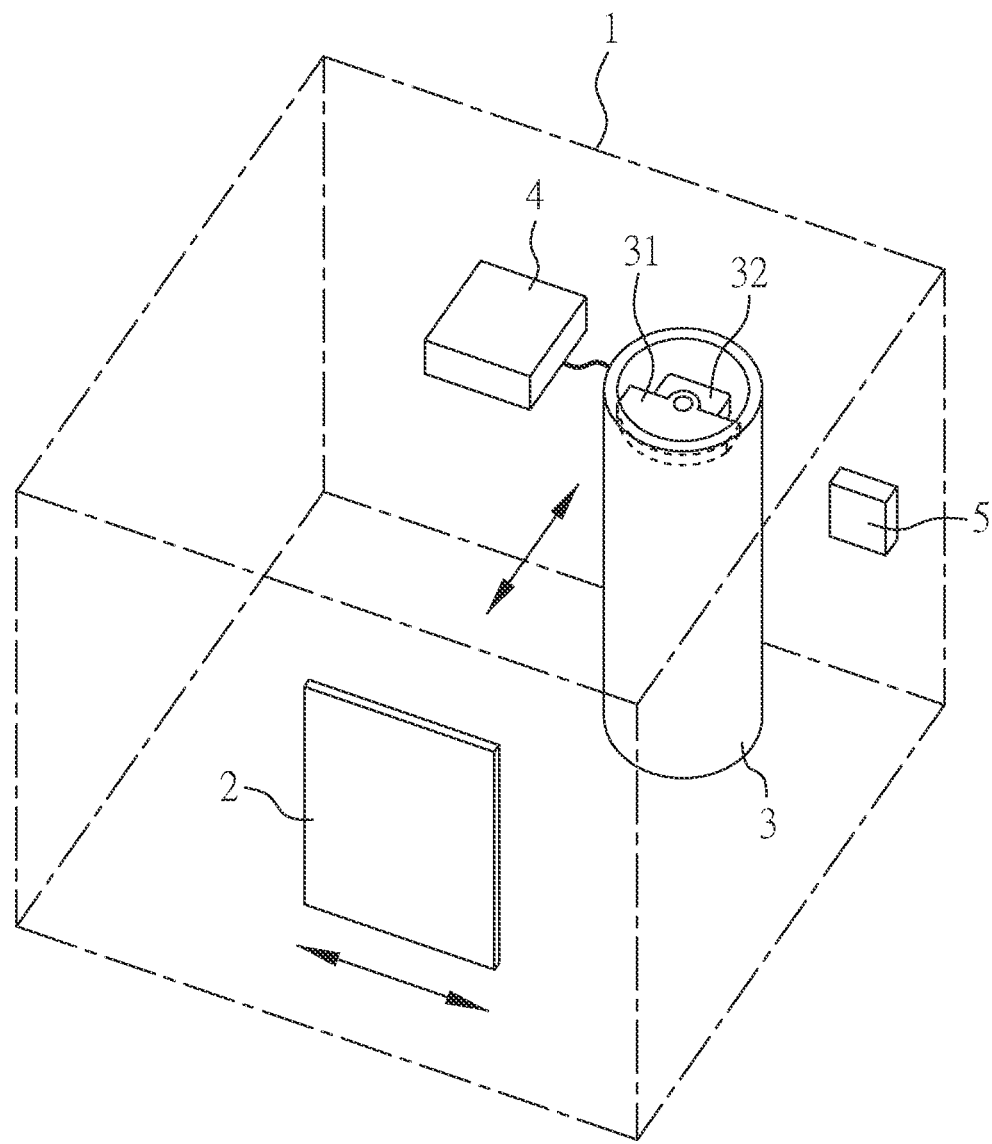
FIG. 1A is a schematic diagram of a coating device for a curved substrate according to an embodiment of the present disclosure.
Figure 1A:
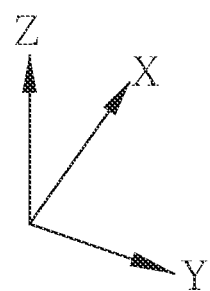
Figure 1B:
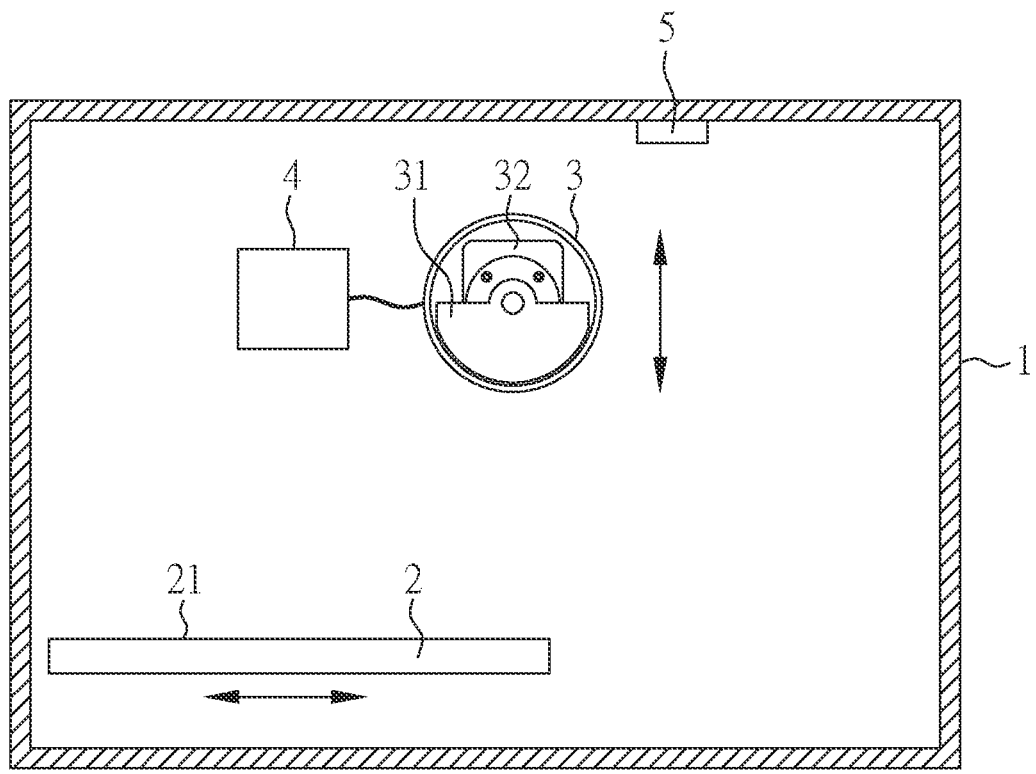
FIG. 1B is a top view of FIG. 1A.
Figure 1B:
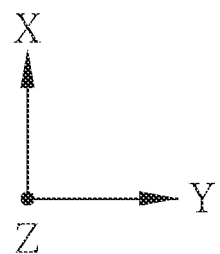

FIG. 1A is a schematic diagram of a coating device for a curved substrate according to an embodiment of the present disclosure. FIG. 1B is a top view of FIG. 1A.

As shown in FIG. 1A and FIG. 1B, the coating device for a curved substrate of the present disclosure comprise: a chamber 1; a carrying platform 2 disposed in the chamber 1 and having a first surface 21, wherein the carrying platform 2 is used to carry a curved substrate (not shown); a sputtering mechanism 3 disposed in the chamber 1 and corresponding to the carrying platform 2; and a position-adjusting mechanism 4. The sputtering mechanism 3 is used to sputter a coating material to different parts of the surface of the curved substrate at different positions. The position-adjusting mechanism 4 can be used to adjust the sputtering mechanism 3 to different positions. Specifically, the position-adjusting mechanism 4 can adjust the sputtering mechanism 3 to different positions according to the distance between the different parts of the surface of the curved substrate and the sputtering mechanism 3. In the present disclosure, adjusting the position of the sputtering mechanism 3 can mean adjusting the relative position between the sputtering mechanism 3 and the carrying platform 2. According to some embodiments, the position-adjusting mechanism 4 can be connected to at least one of the sputtering mechanism 3 and the carrying platform 2 to adjust the relative position between the sputtering mechanism 3 and the carrying platform 2 such that the curved substrate on the carrying platform 2 will be adjusted to different relative positions. According to some embodiments, the position-adjusting mechanism 4 can also be connected to both of the sputtering mechanism 3 and the carrying platform 2 simultaneously. According to some embodiments, the position-adjusting mechanism 4 can be connected to the sputtering mechanism 3, and the position-adjusting mechanism 4 can adjust the sputtering mechanism 3 in a first direction X. In other words, the position-adjusting mechanism 4 can be used to adjust the position of the sputtering mechanism 3 in the first direction X. The first direction X can be parallel to the normal direction of the first surface 21 of the carrying platform 2.

In detail, a curved substrate (not shown) is placed on the first surface 21 of the carrying platform 2, and the position-adjusting mechanism 4 can adjust the relative position of the sputtering mechanism 3 and the carrying platform 2 in the first direction X, that is, adjust the distance between the sputtering mechanism 3 and the curved substrate. According to some embodiments, with respect to different areas of the curved substrate (for example, different parts of the surface of the curved substrate), the position-adjusting mechanism 4 can adjust the distance between the curved substrate and the sputtering mechanism 3 to a fixed distance. Accordingly, even if the surface of the curved substrate is in different areas, an even coating thickness can be obtained.

Herein, the sputtering mechanism 3 can comprise a sputtering target fir sputtering a coating material to the curved substrate. The present disclosure is not restrictive of the coating material. For example, the coating material can be an insulating material, a conductive material, a metal material, a ceramic material, a metal oxide, or a combination thereof. For instance, the metal material can be molybdenum, gold, silver, platinum, copper, nickel, chromium, iron, tin, indium, titanium or alloys thereof; the ceramic material comprises oxides, carbides, nitrides or fluorides, such as silicon oxide, titanium oxide, niobium pentoxide, indium tin oxide, and silicon nitride. However, the present disclosure is not limited thereto.

In the present disclosure, the sputtering mechanism 3 can comprise a magnet 31 for adjusting the sputtering direction of the sputtering mechanism 3. Specifically, the sputtering mechanism 3 can comprise an angle-adjusting unit 32; and, the sputtering mechanism 3 is disposed in the chamber 1 and connected to the magnet 31. The angle-adjusting unit 32 controls the magnet 31 to achieve the purpose of adjusting the sputtering direction.

As shown in FIG. 1A and FIG. 1B, the coating device for a curved substrate of the present disclosure may comprise a first sensor 5 disposed adjacent to the sputtering mechanism 3. In the present embodiment, as shown in FIG. 1A, the first sensor 5 is disposed on a side wall of the chamber 1, but the present disclosure is not limited thereto. According to some embodiments, in the first direction X, the sputtering mechanism 3 can be disposed between the carrying platform 2 and the first sensor 5. According to some embodiments, the first sensor 5 can be used to detect the distance between the sputtering mechanism 3 and the curved substrate. Specifically, in different areas, the surface of the curved substrate comprises different parts, and the first sensor 5 can be used to detect the distance between the sputtering mechanists 3 and different parts of the surface of the curved substrate. Specifically, the first sensor 5 can be used to detect the distance between the sputtering mechanism 3 and the curved substrate in the first direction X. For example, the first sensor 5 can be an optical sensor. In an embodiment of the present disclosure, the first sensor 5 can comprise a curvature sensing unit for detecting the curvature of different parts of the surface of the curved substrate. According to some embodiments, a predetermined distance between the sputtering mechanism 3 and the surface of the curved substrate can be set. When the first sensor 5 detects that the distance between the sputtering mechanism 3 and the surface of the curved substrate does not meet the predetermined distance, the position-adjusting mechanism 4 can adjust the position of the sputtering mechanism 3, allowing the distance between the sputtering mechanism 3 and the surface of the curved substrate to meet the predetermined distance. Accordingly, the sputtering mechanism 3 can sputter the curved substrate at the position being adjusted.

Figure 2:
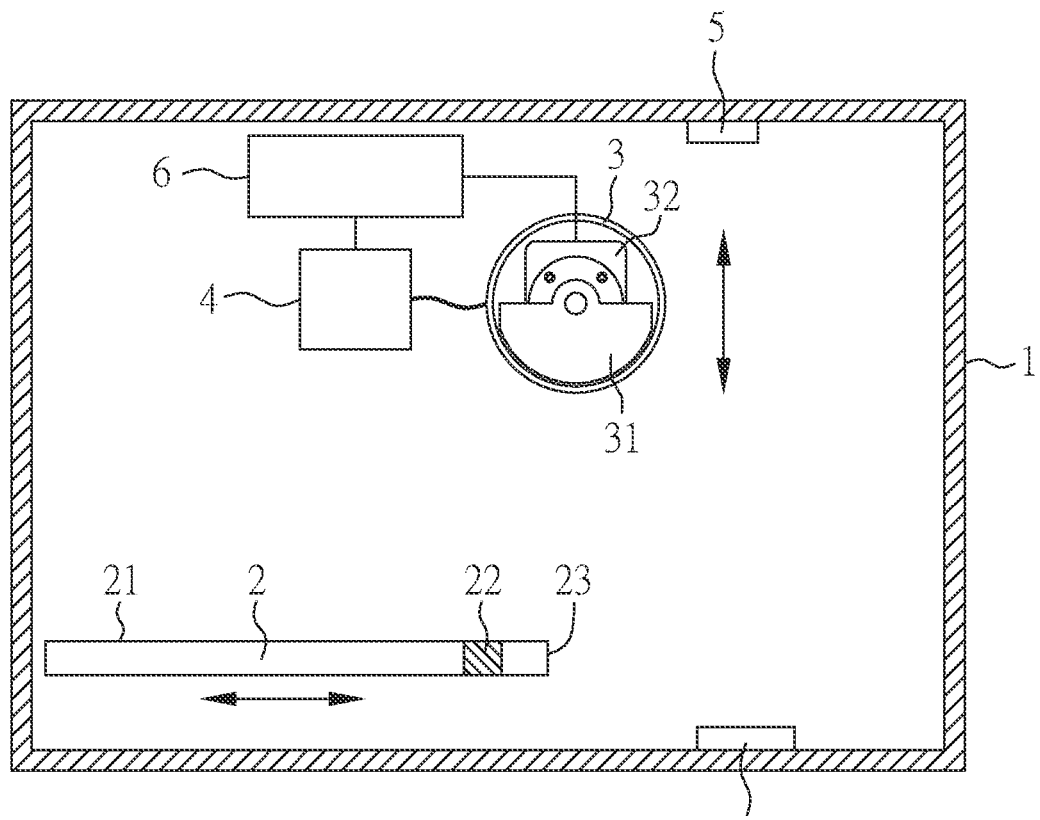
FIG. 2 is a top view of a coating device fir a curved substrate according to another embodiment of the present disclosure.

FIG. 2 is a top view of a coating device fir a curved substrate according to another embodiment of the present disclosure. The coating device of FIG. 2 is similar to that of FIG. 1B, except for the following differences.

As shown in FIG. 2, the coating device for a curved substrate of the present disclosure can comprise a processor 6 for storing a data. According to some embodiments, the processor 6 can be connected to the position-adjusting mechanism 4. According to the data stored in the processor 6, the position-adjusting mechanism 4 can adjust the sputtering mechanism 3 to different positions, and the sputtering mechanism 3 performs sputtering at different positions. According to some embodiments, the data comprises the distances between different parts of the surface of the curved substrate and the first surface 21 of the carrying platform 2. According to the distance data of different parts of the surface of the curved substrate stored in the processor 6, the sputtering mechanism 3 can be adjusted to different positions, allowing the distance between the sputtering mechanism 3 and the surface of the curved substrate to meet the predetermined distance, and sputtering will be performed.

According to some embodiments, the processor 6 can be connected to the position-adjusting mechanism 4 and the angle-adjusting unit 32 respectively. The data comprises the distance between the sputtering mechanism 3 and the curved substrate in the first direction X, and the curvature of the curved substrate. However, the present disclosure is not limited thereto. The distance between the sputtering mechanism 3 and the curved substrate and the sputtering direction can be adjusted by the processor 6 through setting the position-adjusting mechanism 4 and angle-adjusting unit 32, thereby improving the quality of the sputtered film. In an embodiment of the present disclosure, the processor 6 can also be connected to the position-adjusting mechanism 4 and the first sensor 5 respectively; and, the processor 6 can activate the position-adjusting mechanism 4 based on the distance, which is detected by the first sensor 5, between the sputtering mechanism 3 and the curved substrate, thereby keeping the curved substrate and the sputtering mechanism 3 at a fixed distance.

In the present disclosure, the coating device for a curved substrate can comprise a second sensor 7, wherein the carrying platform 2 is disposed between the second sensor 7 and the sputtering mechanism 3. In addition, the second sensor 7 can be used to detect the distance between the carrying platform 2 and the second sensor 7 in the second direction Y, wherein the second direction Y can be perpendicular to the first direction X. More specifically, the carrying platform 2 may comprise a reflecting plate 22 located at one end of the carrying platform 2. The reflecting plate 22 can be disposed adjacent to an edge 23 of the carrying platform 2 or at a distance from the edge 23 of the carrying platform 2. When the sensor 7 detects that the distance between the carrying platform 2 and the second sensor 7 in the second direction Y meets the predetermined value, the sputtering mechanism 3 is activated to perform sputtering. In the present disclosure, the second sensor 7 can be a photo sensor.

The coating method for curved substrates of the present disclosure will be described in detail below.

Figure 3:
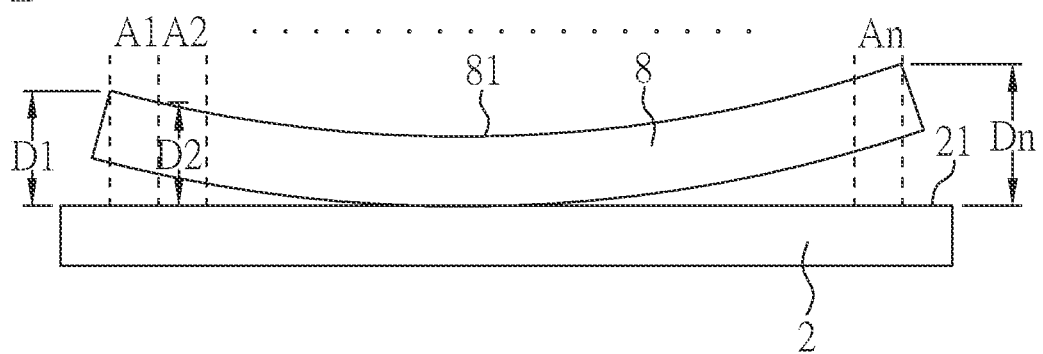
FIG. 3 is a schematic diagram of a curved substrate disposed on a carrying platform according to an embodiment of the present disclosure.

First, referring to FIG. 3, it is a schematic diagram of a curved substrate 8 disposed on a carrying platform 2 according to an embodiment of the present disclosure. More specifically, the curved substrate 8 is disposed on the first surface 21 of the carrying platform 2.

In an embodiment of the present disclosure, the shape of the curved substrate 8 is shown in FIG. 3. More specifically, the curved substrate 8 can be bent in a direction away from the carrying platform 2 to form a concave substrate, but the present disclosure is not limited thereto. For example, the curved substrate 8 can also be bent toward the carrying platform to form a convex substrate, or the curved substrate 8 may also be a curved substrate with a plurality of concave portions and/or a plurality of convex portions. Therefore, the curved substrate 8 in FIG. 3 is only an exemplary embodiment, and does not impose particular limitation on the shape of the curved substrate 8 of the present disclosure.

As shown in FIG. 3, the curved substrate 8 has a second surface 81. The second surface 81 can be divided into a plurality of parts, including a first part A1, a second part A2 . . . to an Nth part An. The distance between each part (A1 to An) and the first surface 21 of the carrying platform 2 is denoted as a corresponding distance, including a first distance D1, a second distance D2 . . . to an Nth distance Dn; and, the corresponding distance adjacent to each other is not the same. In addition, each part (A1 to An) of the second surface 81 of the curved substrate 8 corresponds to a curvature, and each adjacent curvature can be the same or different. Herein, the material of the curved substrate 8 is not particularly limited, and may comprise a plastic substrate or a glass substrate. However, the present disclosure is not limited thereto. For example, the curved substrate 8 may comprise glass, quartz, sapphire, ceramics, polycarbonate (PC), polyimide (PI), polyethylene terephthalate (PET), other suitable substrate materials, or a combination thereof.

Figure 4A:
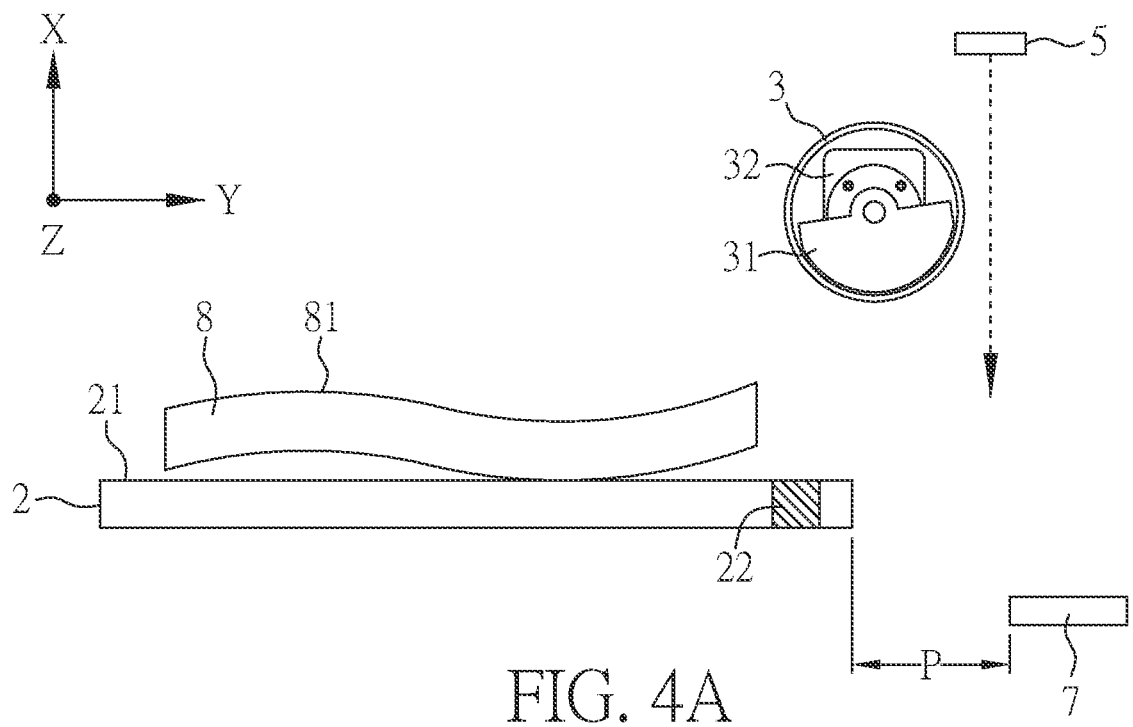
FIG. 4A to FIG. 4C are schematic diagrams of the coating method of the curved substrate of the present disclosure.
Figure 4B:
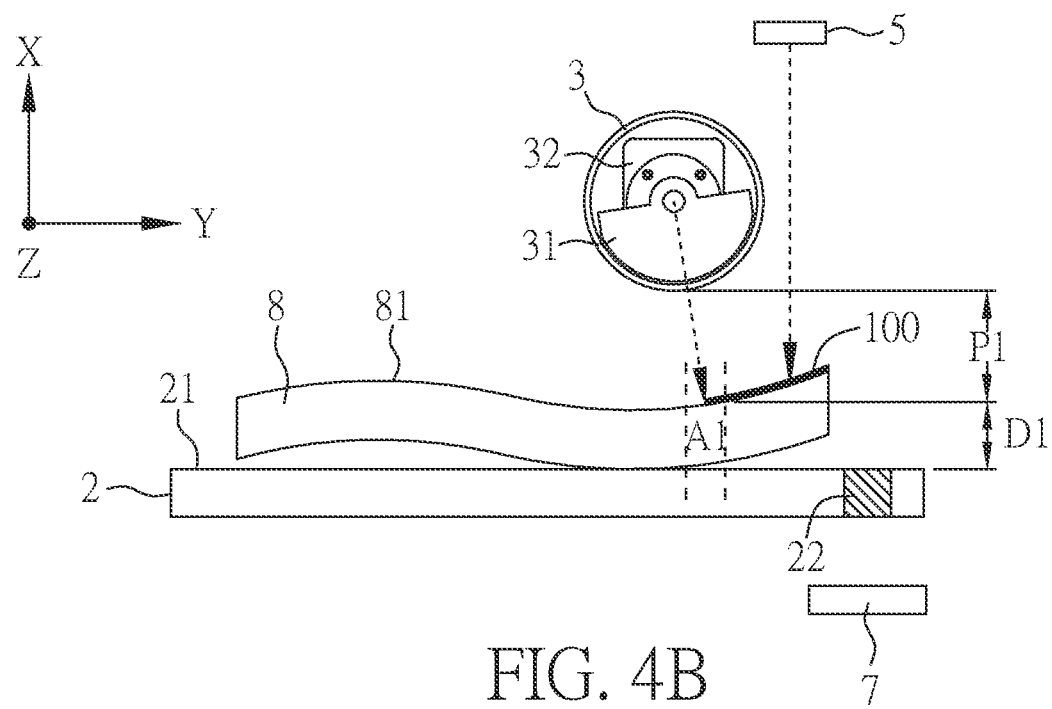
Figure 4C:
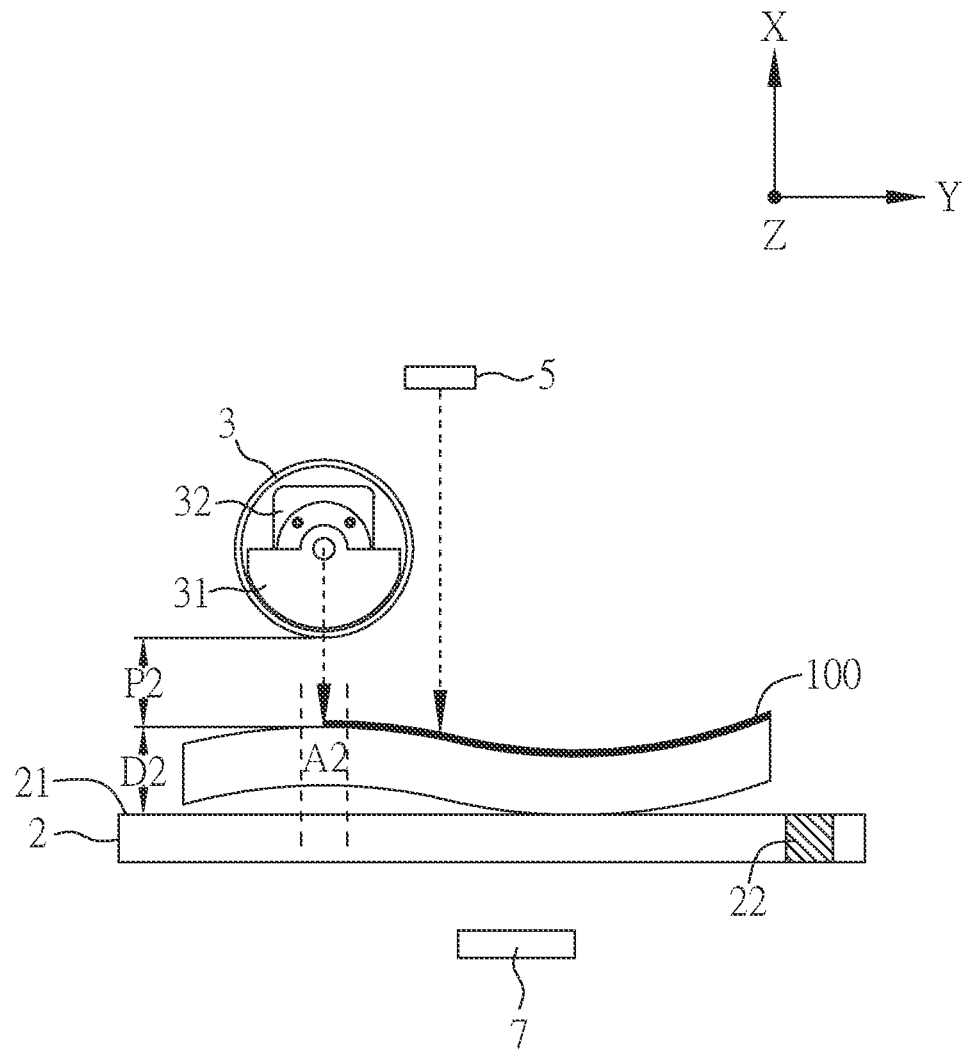

FIG. 4A and FIG. 4C are schematic diagrams of the coating method of the curved substrate of the present disclosure.

As shown in FIG. 4A, a coating device is provided, wherein the coating device is disclosed in FIG. 1A, FIG. 1B or FIG. 2. For the convenience of description, some elements in the coating device are omitted from FIG. 4A to FIG. 4C.

Still referring to FIG. 4A, a curved substrate 8 is provided and disposed on the first surface 21 of the carrying platform 2, and the curved substrate 8 has a second surface 81. The second surface 81 may comprise a first part A1 and a second part A2, as shoe in FIG. 4B and FIG. 4C. The distance between the first surface 21 and the first part A1 of the second surface 81 is denoted as a first distance D1; the distance bet wee the first surface 21 and the second part A2 of the second surface 81 is denoted as a second distance D2; and the first distance D1 is different the second distance D2. Herein, the positions of the first part A1 and the second part A2 in FIG. 4B and FIG. 4C are exemplary aspects to describe the different positions of the second surface 81 of the curved substrate 8; and, the first part A1 and the second part A2 can be adjacent (as shown in FIG. 3) in other embodiments of the present disclosure. The present disclosure does not impose particular limitation on the curvature of the curved substrate 8. As shown in FIG. 4B and FIG. 4C, in an embodiment of the present disclosure, the first part A1 of the second surface 81 has a first curvature, the second part A2 of the second surface 81 bas a second curvature, and the first curvature is different from the second curvature. In another embodiment of the present disclosure, the first curvature can be the same as the second curvature.

Next, the sputtering mechanism 3 is adjusted to a different position by the position-adjusting mechanism 4. Specifically, the sputtering mechanism 3 sputters different parts of the curved substrate 8 (for example, the first part A1 and the second part A2) at different positions. The sputtering mechanism 3 performs sputtering at positions adjusted, and sputters a coating material to different parts of the second surface 81 of the curved substrate 8 to form a coating 100 on the second surface 81 of the curved substrate 8. As shown in FIG. 4B, the carrying platform 2 travels along the second direction Y, so that the curved substrate 8 also progresses along the second direction Y. The second direction Y can be perpendicular to the first direction X. As shown in FIG. 4B, at a first time point, the sputtering mechanism 3 is at the first position to sputter the first part A1 of the second surface 81 of the curved substrate 8. As the curved substrate 8 progresses (as shown in FIG. 4C), the sputtering mechanism 3 is at the second position to sputter the second part A2 of the second surface 81 of the curved substrate 8 at a second time point. The first time point and the second time point are different. The first position and the second position are located in different positions in the first direction X. In some embodiments, said first position can mean the position where the sputtering mechanism 3 and the first surface 21 of the carrying platform 2 are a first specific distance apart in a first direction X at a first time point. Taking FIG. 4B as an example, the first specific distance is defined by adding the distance P1 with the first distance D1, wherein the distance P1 is defined by the distance between the sputtering mechanism 3 and the first part A1 of the second surface 81. Similarly, said second position can mean the position where the sputtering mechanism 3 and the first surface 21 of the carrying platform 2 are a second specific distance apart in a first direction X at a second time point. Taking FIG. 4C as an example, the second specific distance is defined by adding the distance P2 with the second distance D2, wherein the distance P2 is defined by the distance between the sputtering mechanism 3 and the second part A2 of the second surface 81.

According to some embodiments, before the sputtering mechanism 3 is adjusted to different positions by the position-adjusting mechanism 4, the coating method can comprise detecting the distance between the sputtering mechanism 3 and different parts of the second surface 81 of the curved substrate 8. According to some embodiments, the position-adjusting mechanism 4 adjusts the sputtering mechanism 3 in the first direction X. For example, the first direction X can be parallel to the normal direction of the first surface 21 of the carrying platform 2.

More specifically, when the sputtering mechanism 3 performs sputtering after adjusting its position, the distance P1 between the sputtering mechanism 3 and the first part A1 of the second surface 81 is approximately equal to the distance P2 between the sputtering mechanism 3 and the second part A2 of the second surface 81, as shown in FIG. 4B and FIG. 4C. The present disclosure keeps the second surface 81 of the curved substrate 8 and the sputtering mechanism 3 at a fixed distance by using the position-adjusting mechanism 4 to adjust the position of sputtering 3 in the first direction X, thereby achieving the purpose of improving the coating uniformity.

According to some embodiments, the coating 100 formed on the curved substrate 8 can comprise an optical film after sputtering. The sputtered coating layer can be a single layer or multiple layers. The optical film may comprise an anti-reflective film, a polarizing film, an anti-glare film, an anti-scratch film, or a combination thereof. The sputtered coating layer can be an insulating layer or a conductive layer, but the present disclosure is not limited thereto. According to some embodiments, the curved substrate 8 with a sputtered coating layer can be combined with (for example, adhered to) a display panel to form a display.

In an embodiment of the present disclosure, the coating method can comprise detecting the distance between the sputtering mechanism 3 and the second surface 81 in the first direction X by the first sensor 5; and adjusting the position of the sputtering mechanism 3 according to the distance. During the coating process, the first sensor 5 can detect the distance between the second surface 81 of the curved substrate 8 and the sputtering mechanism 3 at any time, so as to adjust or correct the position of the sputtering mechanism 3 in the first direction X at any time, thereby improving the uniformity of the coating thickness.

In an embodiment of the present disclosure, the coating method can comprise detecting a third distance P between the carrying platform 2 and the second sensor 7 in a second direction Y with the second sensor 7, wherein the second direction Y can be perpendicular to the first direction X; and activating the sputtering mechanism 3 when the third distance P meets a predetermined value. As shown in FIG. 4A, the second sensor 7 can detect the third distance P between the carrying platform 2 and the second sensor 7 in the second direction Y at any time, before the sputtering mechanism 3 is activated. The situation where the third distance P meets the predetermined value means that the curved substrate 8 can be sputtered. Therefore, the sputtering mechanism 3 performs the subsequent sputtering step. More specifically, when the signal emitted by the second sensor 7 is reflected by the reflecting plate 22 and received by the second sensor 7, the third distance P can be obtained through conversion; and, the sputtering mechanism 3 can be activated for sputtering when the third distance P meets the predetermined value.

Figure 5B:
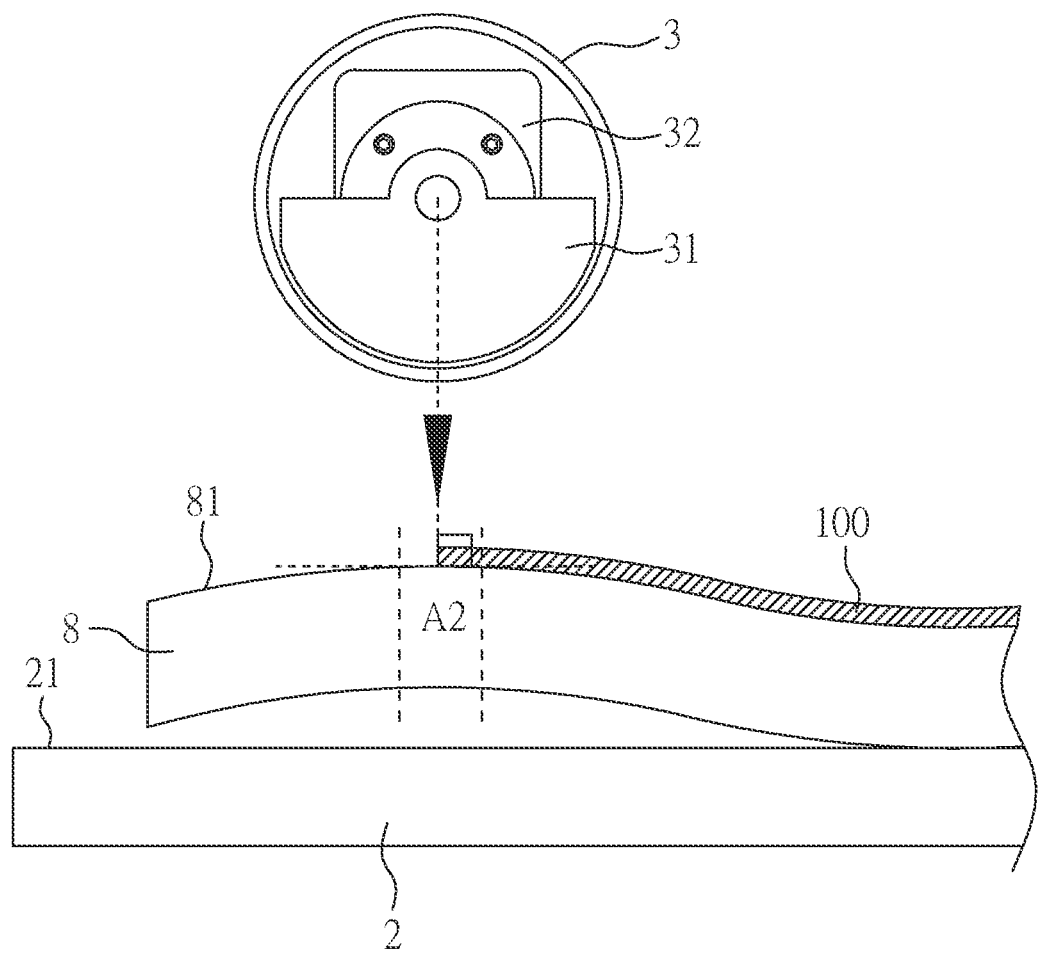

FIG. 5A and FIG. 5B are enlarged views of FIG. 4B and FIG. 4C, respectively. In an embodiment of the present disclosure, the coating method further comprises sputtering the coating material to the first part A1 of the second surface 81 at a first angle θ; and, sputtering the coating material to the second part A2 of the second surface 81 at a second angle; wherein, the first angle θ and the second angle are the angles between the sputtering direction of the sputtering mechanism 3 and the first direction X, and the first angle θ is different from the second angle. More specifically, the angle-adjusting unit 32 can control the magnet 31 to adjust the sputtering direction. During sputtering, the sputtering direction of the sputtering mechanism 3 will be orthogonal to the tangential direction of the first part A1 or the tangential direction of the second part A2. In the present embodiment, the second angle is 0°, as shown in FIG. 5B. However, in other embodiments of the present disclosure, the second angle may not be 0°, and the first angle θ and the second angle may be ranged from positive 90° to negative 90°. More specifically, taking the direction parallel to the normal direction of first surface 21 of the carrying platform 2 as a reference, that is, taking the first direction X as a reference, the first angle θ and the second angle may be defined by rotating the first direction X for 90-degree clockwise and counterclockwise. That is, the first angle θ and the second angle may be ranged from the positive 90° to negative 90° of the first direction X.

In an embodiment of the present disclosure, the coating method can comprise collecting data; storing the data in a processor 6; and, adjusting the sputtering mechanism 3 to different positions by the position-adjusting mechanism 4 based on the data stored in the processor 6, allowing the sputtering mechanism 3 to sputter on the curved substrate 8. The data may comprise the first distance D1, the second distance D2, the first curvature, the second curvature, or a combination thereof. The first distance D1, the second distance D2, the first curvature, and the second curvature can be collected by the known thickness and curvature of the curved substrate 8 to form the data. Alternatively, the coating device for a curved substrate of the present disclosure can be used to obtain such information. More specifically, before the coating begins, the carrying platform 2 moves along the second direction Y and the first sensor 5 scans the curved substrate 8 at the same time. According to some embodiments, data of the curved substrate 8 can be obtained by scanning the curved substrate 8 with the first sensor 5. The data may comprise a first distance D1, a second distance D2, a first curvature, a second curvature, or a combination thereof. In addition, the sputtering mechanism 3 is not activated during the scanning process. After obtaining the information, subsequent coating steps are performed.

In summary, according to some embodiments, the position-adjusting mechanism can adjust the distance between the sputtering mechanism and the curved substrate in different areas of the curved substrate. In so doing, the distance between the curved substrate and the sputtering mechanism can be fixed, thereby improving the uneven thickness of the coating on the curved substrate.

Although the present disclosure has been explained in relation to its embodiment, it is to be understood that many other possible modifications and variations can be made without departing from the spirit and scope of the disclosure as hereinafter claimed.

What is claimed is:

1. A method for coating a curved substrate, comprising:
   providing a coating device comprising: a chamber, a carrying platform, a sputtering device, and a position-adjusting device, wherein the carrying platform is disposed in the chamber and has a first surface, the sputtering device comprises a sputtering target, the sputtering device is disposed in the chamber and is disposed corresponding to the carrying platform, and the position-adjusting device is disposed in the chamber and connected to at least one of the sputtering device and the carrying platform;

providing a curved substrate, wherein the curved substrate is disposed on the first surface of the carrying platform and the curved substrate has a second surface;

collecting data, wherein the data comprises a distance between a first part of the second surface of the curved substrate and the first surface of the carrying platform, and a distance between a second part of the second surface of the curved substrate and the first surface of the carrying platform;

storing the data in a processor;

adjusting the sputtering device to a first position and a second position in a first direction by the position-adjusting device according to the data stored in the processor, wherein the first direction is parallel to a normal direction of the first surface of the carrying platform; and sputtering a coating material to the first part and the second part of the second surface of the curved substrate by the sputtering device, wherein when the sputtering device is at the first position in the first direction, the coating material is sputtered on the first part of the second surface of the curved substrate, and when the sputtering device is at the second position in the first direction, the coating material is sputtered on the second part of the second surface of the curved substrate.

2. The method of claim 1, wherein a distance between the sputtering device and the first part of the second surface is equal to a distance between the sputtering device and the second part of the second surface during the sputtering process.

3. The method of claim 1, wherein the first part has a first curvature, the second part has a second curvature, and the first curvature is different from the second curvature.

4. The method of claim 1, wherein the method comprises: sputtering the coating material to the first part at a first angle, and sputtering the coating material to the second part at a second angle, wherein the first angle and the second angle are the angles included between the sputtering direction of the sputtering device and the first direction, and the first angle is different from the second angle.

5. The method of claim 4, wherein the sputtering direction of the sputtering device is orthogonal to a tangential direction of the first part or a tangential direction of the second part during sputtering.

6. The method of claim 1, wherein the coating device further comprises a first sensor disposed adjacent to the sputtering device, wherein before adjusting the sputtering device, the method further comprises: detecting a distance between the sputtering device and the first part of the second surface of the curved substrate by the first sensor, and detecting a distance between the sputtering device and the second part of the second surface of the curved substrate by the first sensor.

7. The method of claim 1, wherein the coating device further comprises a second sensor, wherein before sputtering the coating material to the first part of the second surface of the curved substrate and before sputtering the coating material to the second part of the second surface of the curved substrate, the method further comprises: detecting a distance between the carrying platform and the second sensor in a second direction by the second sensor, wherein the second direction is perpendicular to the first direction.

8. The method of claim 1, wherein before sputtering the coating material to the first part of the second surface of the curved substrate and before sputtering the coating material to the second part of the second surface of the curved substrate, the method further comprises: traveling the carrying platform along a second direction by the position-adjusting device, wherein the second direction is perpendicular to the first direction.

9. The method of claim 1, wherein at a first time point, the sputtering device is at the first position to sputter the first part of the second surface of the curved substrate, at a second time point, the sputtering device is at the second position to sputter the second part of the second surface of the curved substrate, and the first time point and the second time point are different.

10. A coating device for a curved substrate, comprising:
a chamber;
a carrying platform disposed in the chamber and having a first surface, wherein the carrying platform is configured to carry a curved substrate and the curved substrate has a second surface;
a sputtering device disposed in the chamber and corresponding to the carrying platform, wherein the sputtering device comprises a sputtering target and is configured to sputter a coating material to a first part and a second part of the second surface of the curved substrate;
a processor for storing data, wherein the data comprises a distance between the first part of the second surface of the curved substrate and the first surface of the carrying platform, and a distance between the second part of the second surface of the curved substrate and the first surface of the carrying platform; and
a position-adjusting device disposed in the chamber, and the position-adjusting device connected to at least one of the sputtering device and the carrying platform, wherein the position-adjusting device is configured to adjust the sputtering device to a first position and a second position in a first direction according to the data stored in the processor, wherein the first direction is parallel to a normal direction of the first surface of the carrying platform,
wherein when the sputtering device is at the first position in the first direction, the coating material is sputtered on the first part of the second surface of the curved substrate, and when the sputtering device is at the second position in the first direction, the coating material is sputtered on the second part of the second surface of the curved substrate.

11. The coating device of claim 10, wherein the sputtering device comprises an angle adjustment unit for adjusting a sputtering direction of the sputtering device.

12. The coating device of claim 10, comprising a first sensor disposed adjacent to the sputtering device, wherein the first sensor is configured to detect a distance between the sputtering device and the first part of the second surface of the curved substrate, and a distance between the sputtering device and the second part of the second surface of the curved substrate.

13. The coating device of claim 12, wherein the first sensor comprises a curvature sensing unit, and the curvature sensing unit is configured to detect a curvature of the first part of the second surface of the curved substrate, and a curvature of the second part of the second surface of the curved substrate.

14. The coating device of claim 12, wherein the data further comprises a curvature of the first part of the second surface of the curved substrate, and a curvature of the second part of the second surface of the curved substrate.

15. The coating device of claim 10, further comprising a second sensor, wherein the carrying platform is disposed between the second sensor and the sputtering device, and the second sensor is configured to detect a distance between the carrying platform and the second sensor in a second direction, wherein the second direction is perpendicular to the first direction.

16. The coating device of claim 10, wherein the carrying platform comprises a reflecting plate located at one end of the carrying platform.

17. The coating device of claim 10, wherein the sputtering device comprises a magnet, and the magnet is configured to adjust a sputtering direction of the sputtering device.

\* \* \* \* \*